(12) United States Patent
Goldbach et al.

(10) Patent No.: US 7,192,830 B2
(45) Date of Patent: Mar. 20, 2007

(54) METHOD FOR FABRICATING A MEMORY CELL

(75) Inventors: Matthias Goldbach, Dresden (DE); Thomas Mikolajick, Dresden (DE); Albert Birner, Dresden (DE)

(73) Assignee: Infineon Technologies AG, Munich (DE)

( * ) Notice: Subject to any disclaimer, the term of this patent is extended or adjusted under 35 U.S.C. 154(b) by 199 days.

(21) Appl. No.: 10/862,818

(22) Filed: Jun. 7, 2004

(65) Prior Publication Data

US 2005/0014335 A1    Jan. 20, 2005

(30) Foreign Application Priority Data

Jun. 13, 2003    (DE)    ............... 103 26 805

(51) Int. Cl.
*H01L 21/336* (2006.01)

(52) U.S. Cl. ............... 438/257; 257/324; 257/E21.18; 257/E21.21; 257/E21.423; 257/E29.309

(58) Field of Classification Search ............... 438/257, 438/267, 268, 706, 314–326, 90, 254, 258; 257/314–326
See application file for complete search history.

(56) References Cited

U.S. PATENT DOCUMENTS

| | | | |
|---|---|---|---|
| 5,877,523 A | 3/1999 | Liang et al. | |
| 5,937,295 A | 8/1999 | Chen et al. | |
| 6,090,666 A | 7/2000 | Ueda et al. | |
| 6,165,842 A | 12/2000 | Shin et al. | |
| 6,297,095 B1 | 10/2001 | Muralidhar et al. | |
| 6,342,716 B1 | 1/2002 | Morita et al. | |
| 6,400,610 B1 | 6/2002 | Sadd | |
| 6,413,819 B1 | 7/2002 | Zafar et al. | |
| 6,673,677 B2 | 1/2004 | Hofmann et al. | |
| 6,784,103 B1 * | 8/2004 | Rao et al. | 438/680 |
| 6,803,620 B2 * | 10/2004 | Moriya et al. | 257/298 |
| 6,816,414 B1 * | 11/2004 | Prinz | 365/185.29 |
| 2002/0028541 A1 * | 3/2002 | Lee et al. | 438/149 |
| 2002/0190343 A1 | 12/2002 | Jones, Jr. et al. | |
| 2003/0077863 A1 | 4/2003 | Choi et al. | |
| 2003/0134475 A1 | 7/2003 | Hofmann et al. | |
| 2003/0198086 A1 * | 10/2003 | Shukuri | 365/185.18 |
| 2004/0097037 A1 | 5/2004 | Hofmann et al. | |

FOREIGN PATENT DOCUMENTS

DE    100 36911 A1    2/2002
JP    2002170892 A    6/2002

OTHER PUBLICATIONS

Tiwara, S., et al., "A Silicon Nanocrystals Based Memory", Appl. Phys. Lett., vol. 68, No. 10 (Mar. 4, 1996) pp. 1377-1379.
Hradsky, B., et al., "Local Charge Storage in Silicon Nanocrystal Memories," Nonvolatile Semiconductor Memory Workshop, Session 6 (Feb. 19, 2003) pp. 99-100.

* cited by examiner

*Primary Examiner*—Quoc Hoang
(74) *Attorney, Agent, or Firm*—Slater & Matsil, L.L.P.

(57) ABSTRACT

Silicon nanocrystals are applied as storage layer (6) and removed using spacer elements (11) laterally with respect to the gate electrode (5). By means of an implantation of dopant, source/drain regions (2) are fabricated in a self-aligned manner with respect to the storage layer (6). The portions of the storage layer (6) are interrupted by the gate electrode (5) and the gate dielectric (4), so that a central portion of the channel region (3) is not covered by the storage layer (6). This memory cell is suitable as a multi-bit flash memory cell in a virtual ground architecture.

17 Claims, 2 Drawing Sheets

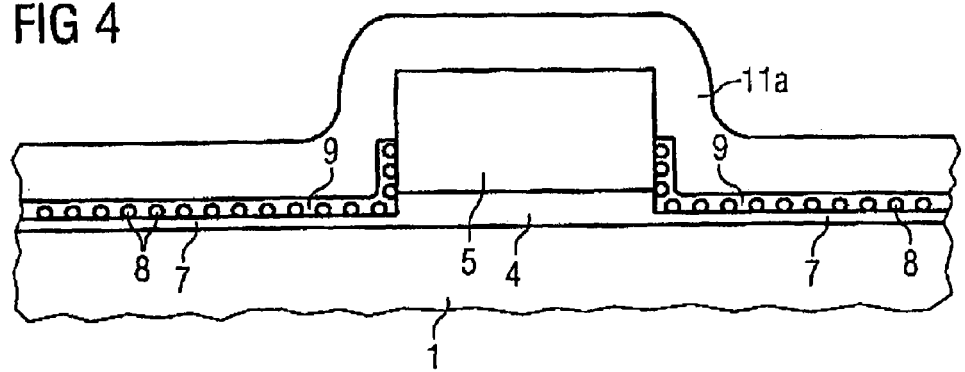
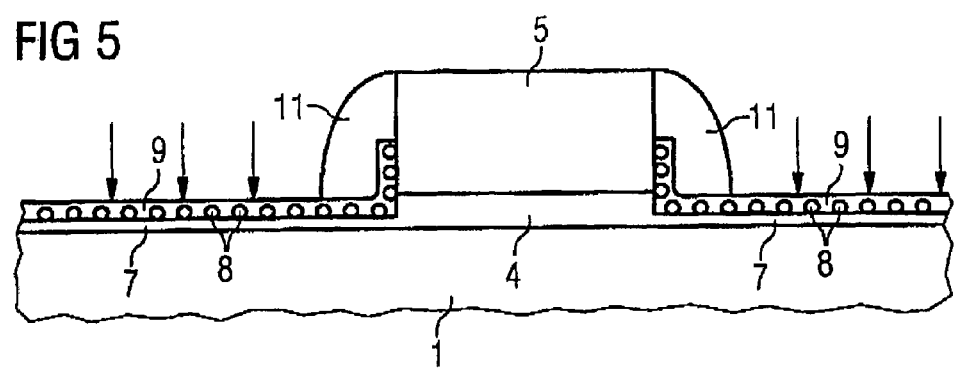
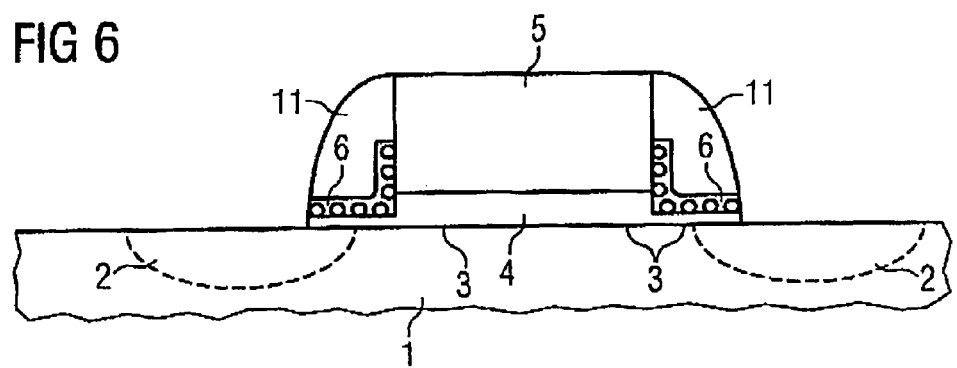

METHOD FOR FABRICATING A MEMORY CELL

This application claims priority to Germany Patent Application 103 26 805.7, which was filed Jun. 13, 2003 and is incorporated herein by reference.

TECHNICAL FIELD

The present invention relates generally to a memory device, and more particularly to a method for fabricating a memory cell.

BACKGROUND

U.S. Pat. No. 5,877,523 describes a semiconductor memory cell that is suitable for storing a plurality of bits. In the case of this cell, two floating gate electrodes separated from one another are situated at the ends of a channel region above two adjoining LDD regions of source and drain. A control gate electrode is present for driving purposes. Charges can be stored separately in the two floating gate electrodes in order to change the relevant programming state of the cell. In a central portion of the channel region, only the control gate electrode is situated above a dielectric layer on the semiconductor material.

German Patent No. 100 36 911 C2 (also U.S. Pat. No. 6,673,677) describes a method for fabricating a multi-bit memory cell that has separate portions of a storage layer, which are provided for charge trapping and are present in each case at the boundaries between source and drain, respectively, and the channel region. In the case of this method, a source region and a drain region are formed by introduction of dopant in a semiconductor body. A storage layer provided for the storage of charge carriers is arranged above the regions between boundary layers. It is possible for the storage layer to be a nitride, in particular, and for the boundary layers to be oxide. The storage layer is removed with the exception of regions situated at the boundary between the channel region and the source region and, respectively, at the boundary between the channel region and the drain region. Therefore, the storage layer is interrupted above a central portion of the channel region. This structure is fabricated by fabricating an auxiliary layer having a cutout in the region of the storage layer, and by fabricating spacers at the sidewalls of the auxiliary layer. The central portions of the storage layer are then removed between the spacers. Only then is the gate electrode fabricated and patterned.

Multi-bit flash memory cells have acquired increasing importance in the meantime. Instead of an interrupted storage layer, it is possible to use a continuous charge trapping layer, which is programmed and erased by local injection of charge carriers. In this case, however, the location of the charge stores is designed only by the mechanism of charge carrier injection, but not by the storage medium itself.

The publications in respect of the IEEE Nonvolatile Semiconductor Memory Workshop (NVSMW) 2003, in particular the paper by B. Hradsky et al., "Local Charge Storage in Silicon Nanocrystal Memories", pp. 99–100, and the publication by S. Tiwari et al., "A silicon nanocrystals based memory", Appl. Phys. Lett. 68, 1377–1379 (1996), describe semiconductor memories having memory cells with a storage medium comprising silicon nanocrystals between the gate electrode and the channel of a transistor structure.

U.S. Pat. No. 6,342,716 B1 describes memory cells containing nanocrystals for forming floating gate electrodes laterally with respect to the channel regions and at the sidewalls of the gate electrodes.

SUMMARY OF THE INVENTION

In one aspect, the present invention provides an improved fabrication method for a multi-bit flash memory cell.

In the case of the memory cell, source/drain regions are formed at a topside of a semiconductor body or substrate by introduction of dopant. A channel region is provided between the source/drain regions, and a gate dielectric and a gate electrode are arranged on tge channel region. A storage layer comprising silicon nanocrystals is present above a region in which the channel region adjoins a source/drain region, so that the storage layer is interrupted above a central portion of the channel region present between these portions. The storage layer may, in particular, be present laterally with respect to the gate electrode and be interrupted by the gate dielectric and/or the gate electrode. The storage layer may in each case cover at least a portion of the sidewalls of the gate electrode.

In the case of the method, after the fabrication of the gate dielectric and the gate electrode, a thin base layer, preferably made of oxide, is applied laterally with respect to the gate electrode. Silicon nanocrystals are then deposited onto the base layer. The silicon nanocrystals are covered with a thin covering layer, preferably an oxide. An auxiliary layer is deposited and removed to an extent such that the silicon nanocrystals present at the sidewalls of the gate electrode are accessible from above and can be etched back including the covering oxide. After the removal of the auxiliary layer, spacers are fabricated at the sidewalls of the gate electrode. The spacers, as a mask, cover the silicon nanocrystals laterally with respect to the gate electrode. The laterally uncovered silicon nanocrystals are removed. Afterwards, dopants may be implanted in order to form the source/drain regions in a self-aligned manner with respect to the gate electrode. It is also possible to fabricate further spacers or to effect an additional heat treatment in order to more exactly define the positions of the later charge carrier injections.

This method may also advantageously be used for fabricating charge trapping memory cells having a storage layer made of one of the materials known per se for this. In this case, a storage layer suitable for charge trapping of charge carriers from the channel is provided instead of the silicon nanocrystals. There are materials appropriate for this, such as for example, $Si_3N_4$, $Al_2O_3$ tantalum oxide, hafnium silicate or intrinsically conducting silicon, preferably with boundary layers made of oxide. The structure of such a charge trapping memory cell with separate portions of the storage layer at source and drain, which memory cell can be fabricated particularly advantageously according to the method described here, is discernible from the fact that at least small vertical portions of the storage layer are also present at the sidewalls of the gate electrode.

BRIEF DESCRIPTION OF THE DRAWINGS

Examples of the memory cell and of the fabrication method are described in more detail below with reference to the accompanying FIGS. 1 to 6.

FIG. 4 shows a cross-section through a further intermediate product of the fabrication method after the application of a polysilicon layer provided for spacers;

FIG. 5 shows a cross-section through a further intermediate product of the fabrication method after the formation of spacers; and FIG. 6 shows a cross-section through the memory cell after the implantation of the source/drain regions.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
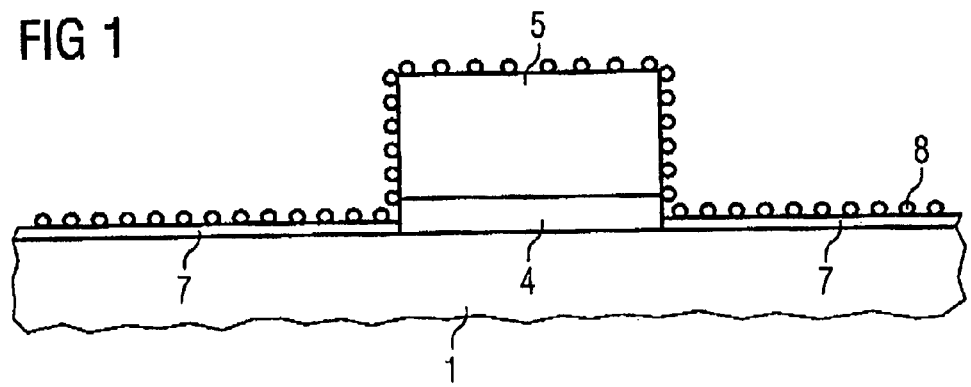
FIG. 1 shows a cross-section through an intermediate product of the fabrication method after the deposition of the silicon nanocrystals.

A description is given of a preferred fabrication method for an exemplary embodiment of the memory cell. FIG. 1 shows a cross-section through a semiconductor body 1 or a substrate made of semiconductor material. Between the memory cells or active areas, it is possible, as known per se, to fabricate trench isolations (e.g., STI, shallow trench isolation) or the like and to fabricate the doped wells provided for the memory transistors and the transistors of the driving periphery.

A thin layer of a gate dielectric 4 is then applied to the topside of the semiconductor body 1, which layer is preferably an oxide of the semiconductor material, e.g., silicon dioxide, and typically has a thickness of less than 20 nm. Other insulating materials, e.g., silicon nitride, could alternatively, additionally be used.

The material of the gate electrode 5 (e.g., polysilicon, polycide or metal) is applied thereto and patterned, if appropriate, using a hard mask. After the fabrication of the gate electrode 5, it is possible, as required, to effect implantations of dopant for forming LDDs (lightly doped drains), it also being possible to effect so-called halo implantations. These doped regions can be fabricated in a manner that is known per se from memory cells and are omitted in the illustration of FIG. 1 since they are not essential to the invention.

A thin base layer 7 is then applied on both sides of the gate electrode 5. The layer preferably has a thickness of 1 nm to 10 nm and is, for example, an oxide. Silicon nanocrystals are then deposited as a storage medium onto the topside in a manner known from the prior art. This is preferably done selectively whilst favoring the oxide of the base layer 7. The layer comprising the silicon nanocrystals 8 is illustrated over the whole area in FIG. 1. Instead of this, it is possible to deposit a storage layer made of a suitable material, which is provided for charge trapping.

Figure 2:
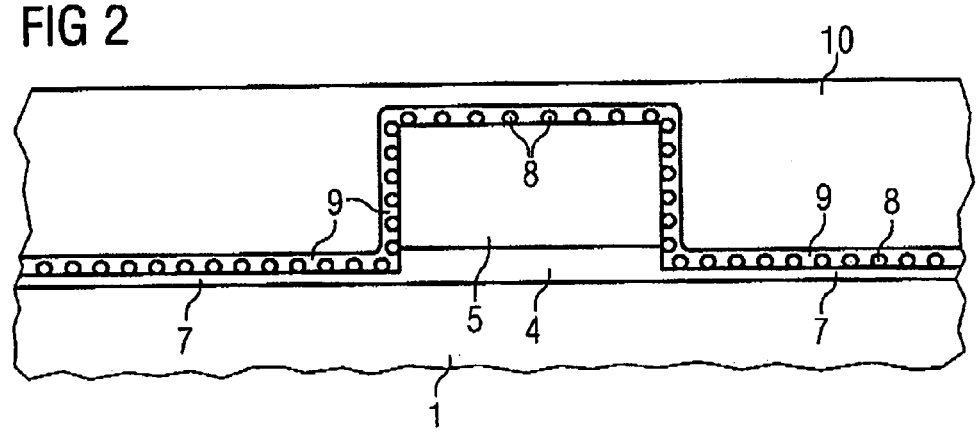
FIG. 2 shows a cross-section through a further intermediate product of the fabrication method after the application of an auxiliary layer.

In accordance with the illustration of FIG. 2, a thin covering layer 9 is deposited onto the topside of the silicon nanocrystals 8 or of the charge trapping storage layer. The covering layer typically has a thickness of approximately 2 nm to 20 nm and preferably is an oxide. It is possible to perform a thermal oxidation for reducing the size of the silicon nanocrystals 8. Afterwards, an auxiliary layer 10 is deposited, which is preferably an organic material, e.g., SiLK™. Other dielectrics, preferably but not necessarily, of the low-k variety, can also be used.

Figure 3:
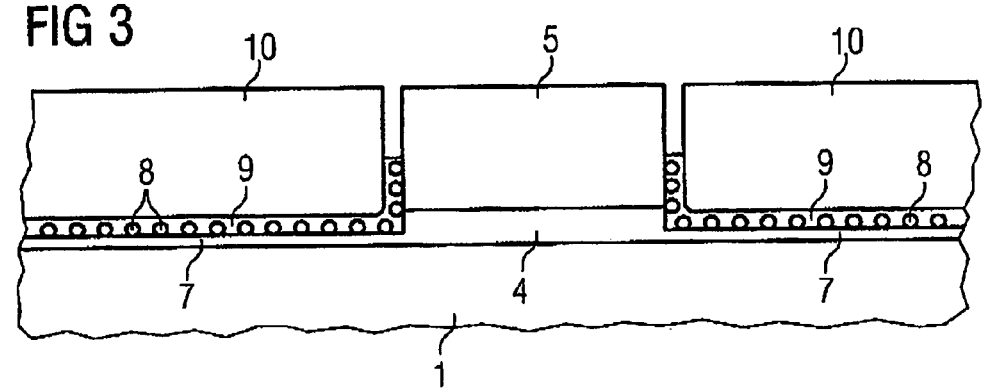
FIG. 3 shows a cross-section through a further intermediate product of the fabrication method after the etching back of the insulator containing the silicon nanocrystals.

In accordance with the illustration of FIG. 3, the auxiliary layer 10 is firstly removed, which is done, e.g., by means of CMP (chemical mechanical polishing) stopping on the material of the gate electrodes or on the material of the auxiliary layer 10. The covering layer 9 above the silicon nanocrystals 8 is then accessible toward the top in the interspace between the gate electrode 5 and the remaining portions of the auxiliary layer 10 and can be at least partly removed by etching at the sidewalls of the gate electrode 5. The auxiliary layer 10 is then removed.

A layer 11a provided for forming conductive spacer elements (spacers), is then deposited over the whole area, as illustrated in cross-section in FIG. 4. The layer 11a is preferably polysilicon. The layer 11a is deposited conformally over the whole area and is subsequently etched back anisotropically so that the spacer elements 11, illustrated in cross-section in FIG. 5, remain at the sidewalls of the gate electrode 5. Using these spacer elements 11 as a mask, the covering layer 9, the silicon nanocrystals 8 or the charge trapping storage layer and the base layer 7 are then removed in the lateral regions. Those portions of the silicon nanocrystals 8 or of the charge trapping storage layer, which are depicted in cross-section in FIG. 6, thus remain as storage layer 6.

Afterwards, the source/drain regions 2 are additionally formed, preferably by means of implantation and activation of dopant. As required, for this purpose it is possible previously to fabricate further spacers and/or to perform an additional heat treatment in order to exactly define the location of charge carrier injection. Further method steps, in particular for fabricating the driving periphery, e.g., using CMOS technology, may follow in the manner that is known per se from semiconductor memories.

The cross-section of FIG. 6 reproduces the structure of the memory cell, in the case of which the storage layer is, in each case, present above a region in which the channel region 3 adjoins a source/drain region 2 or the LDD region thereof. The storage layer 6 is interrupted above a central portion of the channel region 3 that is present in between. Charge carrier injection into the storage layer can thus be effected at both ends of the channel in accordance with the signs of the applied voltages. Therefore, at least 2 bits can be stored in this memory cell.

An advantage of this multi-bit memory cell is, in particular, that the localization of the charge storage is effected both by the mechanism of charge carrier injection and by the extent of the storage medium limited to the relevant regions. This leads to a distinctly improved reliability, in particular to a distinctly better maintenance of the programming state, even after a multiplicity of programming cycles. The method described enables the self-aligned fabrication of the portions of the storage layer with regard to the position of gate and source/drain. The memory cell may be integrated for example into a virtual ground array. However, other flash memory cell array architectures are also possible. In the preferred embodiment, programming is effected by trapping hot electrons (CHE, channel hot electrons); erasure is effected by trapping hot holes in the storage layer or by Fowler-Nordheim tunneling.

Although embodiments of the present invention and its advantages have been described in detail, it should be understood that various changes, substitutions and alterations can be made herein without departing from the spirit and scope of the invention as defined by the appended claims.

What is claimed is:

1. A method for fabricating a memory cell, the method comprising:

forming a gate electrode and an underlying a gate dielectric on an upper surface of a semiconductor body, the gate electrode including first and second sidewall portions;

forming a storage layer including a first portion adjacent the first sidewall portion of the gate electrode and a second portion adjacent the second sidewall portion of the gate electrode, the forming of the storage layer further comprising forming a base layer over the semiconductor body, forming the storage layer over the base layer, and forming a covering layer over the storage layer;

forming a first sidewall spacer adjacent the first sidewall portion of the gate electrode and a second sidewall spacer adjacent the second sidewall portion of the gate electrode, the first sidewall spacer overlying the first portion of the storage layer and the second sidewall spacer overlying the second portion of the storage layer; and forming a first doped region adjacent the first sidewall portion of the gate electrode and a second doped region adjacent the second sidewall portion of the gate electrode;

wherein the base layer is formed over the region of the semiconductor body spaced from the gate electrode, the storage layer and the covering layer are all formed over a top surface of the gate electrode, the method further comprising removing the storage layer and the covering layer from the gate electrode by forming an auxiliary layer over the covering layer, removing an upper portion of the auxiliary layer so as to expose a portion of the covering layer over the gate electrode without exposing a portion of the covering layer over the semiconductor body at a region laterally spaced from the gate electrode, and removing the storage layer and the covering layer from the top surface of the gate electrode by chemical-mechanical polishing the auxiliary layer, and etching portions of the storage layer adjacent the upper portions of the sidewalls of the gate electrode using portions of the auxiliary layer as a mask.

2. The method of claim 1 wherein the auxiliary layer comprises an organic material.

3. The method of claim 1 wherein forming a storage layer comprises depositing silicon nanocrystals on the base layer and wherein the auxiliary layer is removed to an extent such that the silicon nanocrystals deposited on the base layer are covered by the auxiliary layer and the silicon nanocrystals that are present at least at the sidewalls of the gate electrode are accessible from a side remote from the semiconductor body.

4. The method of claim 1 wherein forming a storage layer comprises depositing silicon nanocrystals.

5. The method of claim 4 wherein the covering layer comprises an oxide and wherein the base layer comprises an oxide.

6. The method of claim 1 and further comprising removing a portion of the storage layer over the semiconductor body in a region laterally spaced from the gate electrode using the first and second sidewall spacers and the gate electrode as a mask.

7. The method of claim 1 and further comprising:
performing a thermal oxidation in order to reduce the size of the silicon nanocrystals.

8. The method of claim 1 wherein the storage layer is provided for charge trapping of charge carriers from a channel region, the channel region disposed within the semiconductor body adjacent the gate electrode.

9. The method of claim 1 wherein the first and second sidewall spacers comprise polysilicon.

10. A method for fabricating a memory cell, the method comprising:

forming a gate dielectric and a gate electrode on an upper surface of a semiconductor body;

forming a base layer overlying laterally spaced portions of the semiconductor body on either side of the gate electrode;

depositing a storage layer at least onto the base layer and the gate electrode;

forming a covering layer over the storage layer;

depositing an auxiliary layer over the covering layer;

removing a portion of the auxiliary layer to an extent such that at least a portion of the storage layer is covered by the auxiliary layer and portions of the storage layer that are present at least at sidewalls of the gate electrode are accessible from a side remote from the semiconductor body;

etching portions of the storage layer adjacent the upper portion of the sidewalls of the gate electrode using portions of the auxiliary layer as a mask;

removing remaining portions of the auxiliary layer;

forming spacer elements at the sidewalls of the gate electrode by conformal deposition and anisotropic etching-back of a layer;

using the spacer elements and the gate electrode as a mask, removing portions of the covering layer and the storage layer; and implanting dopants into the semiconductor body in order to form source/drain regions.

11. The method as claimed in claim 10 wherein depositing a storage layer comprises depositing silicon nanocrystals at least onto the base layer and wherein the silicon nanocrystals are provided with the thin covering layer.

12. The method as claimed in claim 11 wherein the auxiliary layer is removed to an extent such that the silicon nanocrystals deposited on the base layer are covered by the auxiliary layer and the silicon nanocrystals that are present at least at sidewalls of the gate electrode are accessible from a side remote from the semiconductor body, and wherein, using the spacer elements and the gate electrode as a mask, the covering layer and the silicon nanocrystals are removed laterally.

13. The method as claimed in claim 11 and further comprising performing a thermal oxidation in order to reduce the size of the silicon nanocrystals.

14. The method as claimed in claim 10 wherein the storage layer is provided for charge trapping of charge carriers from a channel region.

15. The method as claimed in claim 10 wherein the base layer comprises an oxide and wherein the covering layer comprises an oxide.

16. The method as claimed in claim 10 wherein the auxiliary layer comprises an organic material.

17. The method as claimed in claim 10 wherein the spacer elements are formed from a polysilicon layer.

* * * * *